United States Patent
Layman

(10) Patent No.: US 6,281,108 B1
(45) Date of Patent: Aug. 28, 2001

(54) SYSTEM AND METHOD TO PROVIDE POWER TO A SEA OF GATES STANDARD CELL BLOCK FROM AN OVERHEAD BUMP GRID

(75) Inventor: Timothy P. Layman, Danville, CA (US)

(73) Assignee: Silicon Graphics, Inc., Mountain View, CA (US)

( * ) Notice: Subject to any disclaimer, the term of this patent is extended or adjusted under 35 U.S.C. 154(b) by 0 days.

(21) Appl. No.: 09/418,597

(22) Filed: Oct. 15, 1999

(51) Int. Cl.$^7$ ................................................ H01L 21/4763

(52) U.S. Cl. .................... 438/618; 438/622; 438/599; 438/587; 438/637

(58) Field of Search .................................. 438/618, 622, 438/599, 129, 737, 637, 738, 587

(56) References Cited

U.S. PATENT DOCUMENTS 5,742,099 * 4/1998 Debnath et al. ..................... 257/758

OTHER PUBLICATIONS

Tom Burd, *Low Power CMOS Library Design Methodology* (*A HyperText Book*) (created Sep. 27, 1995; visited Oct. 14, 1999) <http://infopad.eecs.berkeley.edu/infopad–ftp/theses/low.power.CMOS.library.MS/>.

Shohji, R. et al., "High Reliability Tungsten–Stacked Via Process with Fully Converted TiAl$_3$ Formation Annealing," *IEEE Transactions on Semiconductor Manufacturing*, vol. 12, No. 3, Aug. 1999, pp. 302–312.

* cited by examiner

*Primary Examiner*—Matthew Smith
*Assistant Examiner*—Igwe U. Anya
(74) *Attorney, Agent, or Firm*—Sterne, Kessler, Goldstein & Fox PLLC

(57) ABSTRACT

A system and method for providing power to the gates of a semiconductor chip routes power and ground from one layer of the chip to another layer of the chip using a first metal strip located at a first metal layer and a second metal strip located at a second metal layer, wherein the second metal layer is not directly adjacent to the first metal layer. A stacked via is used to connect the first metal strip to the second metal strip. The stacked via may comprise, for example, a first via connecting the first metal strip to an intermediate metal strip and a second via connecting the intermediate metal strip to the second metal strip. Alternatively, the stacked via may comprise a plurality of vias connecting the first metal strip to the intermediate metal strip and a plurality of vias connecting the intermediate metal strip to the second metal strip. The system and method avoids using long, parallel metal strips on each layer of the chip to route power and ground from one layer of the chip to another layer of the chip.

20 Claims, 4 Drawing Sheets

SYSTEM AND METHOD TO PROVIDE POWER TO A SEA OF GATES STANDARD CELL BLOCK FROM AN OVERHEAD BUMP GRID

BACKGROUND OF INVENTION

1. Field of the Invention

This invention relates to semiconductor chips. More particularly, it relates to the design of a semiconductor chip. Still more particularly, it relates to a system and method for providing power to the gates of a semiconductor chip.

2. Related Art

An essential part of any semiconductor chip is its internal power network. It is the internal power network that routes power and ground from the pins of the external packaging of the chip to the gates of the chip. In the past, engineers have built elaborated power networks to route power and ground from the top layer of a semiconductor chip down to the lowest layer of a semiconductor chip.

In a conventional system for providing power to the gates of a semiconductor chip, each layer of the chip comprises a series of long, parallel metal strips. The placement of the gates generally dictates the design of the lowest layer of the internal power network while Ohm's law dictates the design of the remaining layers of the internal power network. The gates of a typical chip are formed more or less uniformly across the entire base of a chip. This distribution of gates means that power and ground must be available everywhere at the lowest layer of the chip to power the gates. Conventionally, power and ground are made available at the lowest layer of a chip by depositing a series of long, parallel metal strips. The gates of the chip are formed between these long, parallel metal strips. This arrangement ensures that every gate has access to both power and ground. While any system or method that routes power from one layer of the chip to another layer of the chip, without excessive voltage drop, may be used to route power from the top of the chip down to the lowest layer of the chip, engineers have conventionally made every layer of the internal power network out of long, parallel metal strips. These long, parallel metal strips at each layer of the chip are electrically connected to one another using vias.

This conventional system and method of routing power from the top layer of the chip down to the lowest layer of the chip has many drawbacks, however. For example, the elaborate internal power networks built by engineers in the past occupy a significant portion of the total routing area of a semiconductor chip. Using known internal power networks therefore significantly reduces the total routing area of a chip available for routing gate signal, and it complicates the design of a semiconductor chip. Furthermore, using known internal power networks makes semiconductor chips larger than they otherwise need to be and thereby increases the overall cost of a chip. Using known internal power networks also limits gate density.

What is needed is a simpler system and method for providing power to the gates of a semiconductor chip. As will be described in detail below, the present invention overcomes the drawbacks of the conventional system and method for providing power to the gates of a chip.

SUMMARY OF THE INVENTION

The present invention is directed to a system and method for routing power and ground in a semiconductor chip using stacked vias. The system and method avoids using long, parallel metal strips on each layer of a chip to route power and ground from one layer of the chip to another layer of the chip.

In one embodiment, power or ground is routed between a first metal strip located at a first metal layer and a second metal strip located at a second metal layer, wherein the second metal layer is not directly adjacent to the first metal layer. A stacked via is used to connect the first metal strip to the second metal strip. The stacked via of this embodiment comprises, for example, a first via connecting the first metal strip to an intermediate metal strip and a second via connecting the intermediate metal strip to the second metal strip. Alternatively, the stacked via may comprise a plurality of vias connecting the first metal strip to the intermediate metal strip and a plurality of vias connecting the intermediate metal strip to the second metal strip.

In another embodiment, a plurality of metal strips for routing power or ground are located at a first metal layer and a plurality of stacked vias are used to connect the plurality of metal strips located at the first metal layer to a metal strip located at a second metal layer, wherein the second metal layer is not directly adjacent to the first metal layer.

In still another embodiment, a plurality of metal strips for routing power or ground are located at a first metal layer and a plurality of stacked vias are used to connect the plurality of metal strips located at the first metal layer to a plurality of metal strips located at a second metal layer, wherein the second metal layer is not directly adjacent to the first metal layer.

Further features of the present invention are described in detail below with reference to the accompanying drawings.

BRIEF DESCRIPTION OF THE FIGURES

The system and method of the present invention will be better understood with respect to the accompanying drawings, in which.

DETAILED DESCRIPTION OF THE PREFERRED EMBODIMENTS

Figure 1:
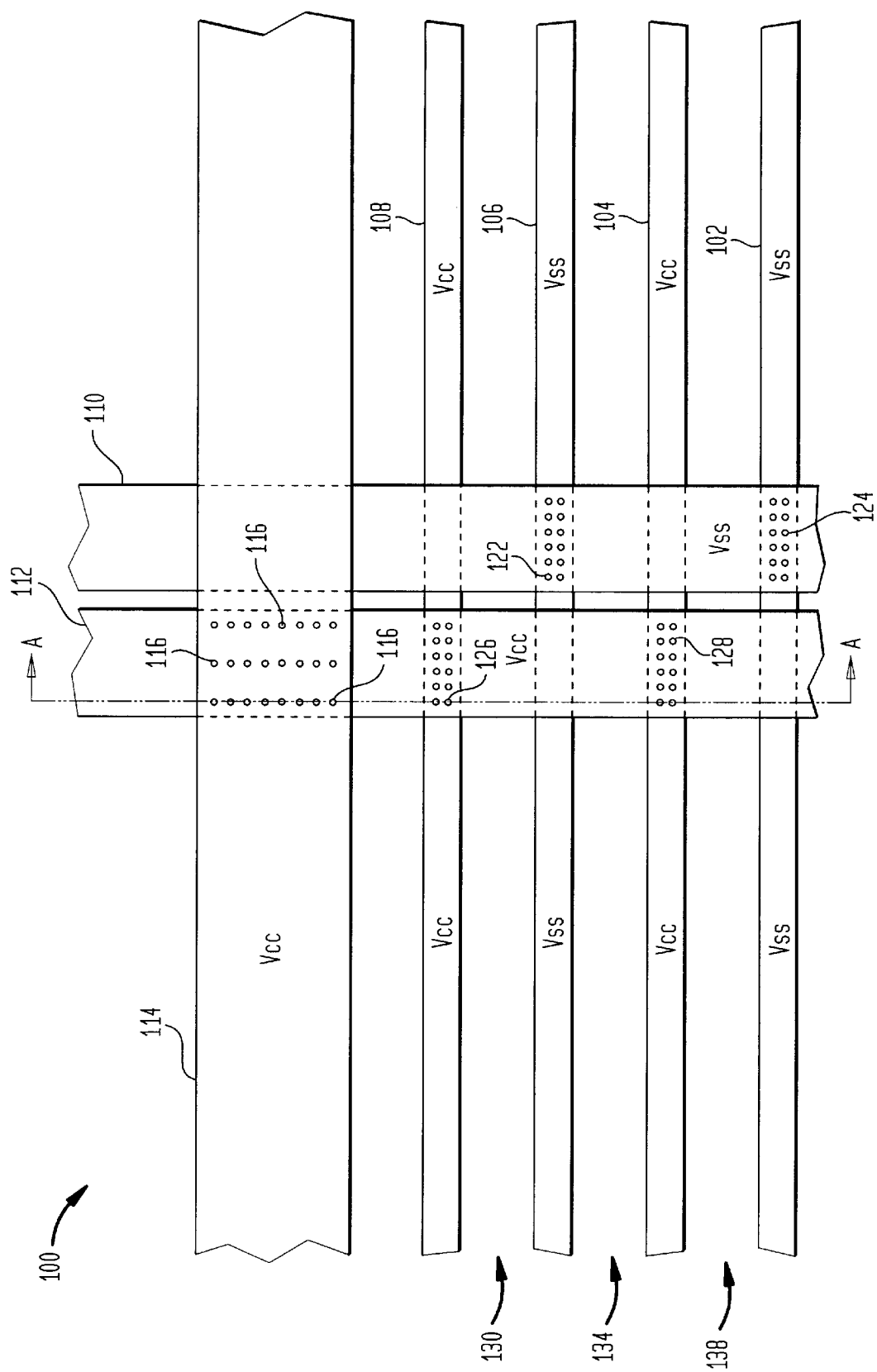
FIG. 1 shows a top view of a conventional internal power network of a semiconductor chip.

The system and method of the present invention are described with reference to the accompanying drawings. In the drawings, like reference numbers indicate identical or functionally similar elements. Additionally, the left-most digit of a reference number identifies the drawing in which the reference number first appears. To better understand the system and method of the present invention, it is useful to first describe a conventional internal power network of a typical semiconductor chip.

FIG. 1 shows a top view of a conventional internal power network 100 of a typical semiconductor chip. Portions of metal layers one, two, and three of the chip are shown. Metal layer one refers to a first layer of metal deposited on a silicon base during manufacturing of a semiconductor chip. As shown in FIG. 1, metal layer one comprises metal strips 102, 104, 106, and 108. Metal layer two refers to a second layer of metal deposited during manufacturing of a semiconductor chip. In FIG. 1, metal layer two comprises metal strips 110 and 112. Finally, metal layer three refers to a third layer of metal deposited during manufacturing of a semiconductor chip. In FIG. 1, metal layer three comprises a metal strip 114. As can be seen in FIG. 1, the metal strips located at metal layers two and three take up a significant amount of the total routing space within the layers of the chip.

In conventional internal power network 100, a series of long, parallel metal strips are located at metal layer one. These long, parallel metal strips are represented by the metal strips 102, 104, 106, and 108. Metal strips 104 and 108 are designated as providing a source of power (Vcc) while metal strips 102 and 106 are designated as providing a source of ground (Vss). The arrangement of these metal strips allows for the formation of gates (not shown) in regions 130, 134, and 138 of the semiconductor chip. By forming the gates (not shown) of the semiconductor chip in these regions, each gate has ready access to both power and ground.

In conventional internal power network 100, metal layer two comprises a series of long, parallel metal strips that are oriented perpendicular to the metal strips located at metal layer one. These long, parallel metal strips are represented in FIG. 1 by the metal strips 110 and 112. Metal strip 112 is designated as Vcc, and it is connected to metal strips 104 and 108 by a plurality of vias, e.g., vias 126 and 128. A via is a hole in the insulating material of the chip that separates adjacent metal strips, and which is filled with a conducting material in order to electrically connect the separated metal strips. Metal strip 110 is designated as Vss, and it is connected to metal strips 102 and 106 by a plurality of vias, e.g., vias 122 and 124.

In a typical semiconductor chip, each layer of a conventional internal power network comprises a series of long, parallel metal strips distributed more or less uniformly across the area of the chip as depicted in FIG. 1. As will be apparent to one skilled in the relevant art, a series of uniformly distributed, parallel metal strips is used at each layer of the chip in order to minimize the total conductor length between the pins of the external packaging (not shown) and the gates of the chip (not shown) to reduce voltage drops resulting from the inherent resistance of the conductor material. If the total conductor length between the pins and the gates is too long, adequate voltage will not be provided to the gates.

In conventional internal power network 100, metal layer three comprises a series of long, parallel metal strips oriented perpendicular to the metal strips located a metal layer two. These long, parallel metal strips are represented in FIG. 1 by the metal strip 114. Metal strip 114 is designated as Vcc, and it is connected to metal strip 112 by a plurality of vias, e.g., vias 116. It is important to note that none of the vias used to connect metal strips are stacked one-above-the-other in a conventional internal power network. This feature of a conventional internal power network is better seen in FIG. 2.

Figure 2:
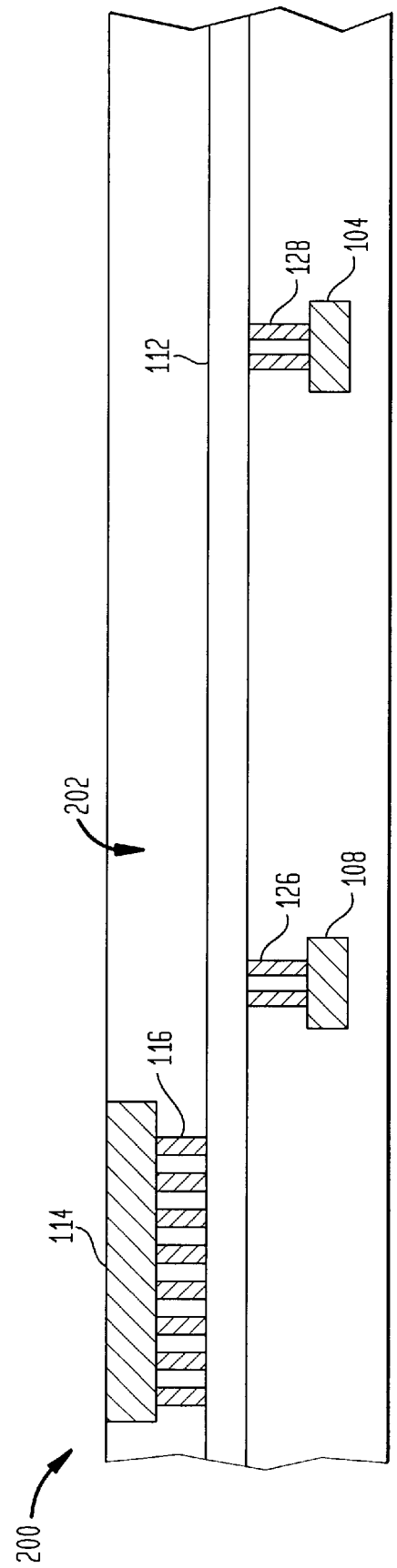
FIG. 2. shows a sectional view of the internal power network of FIG. 1 taken along line A—A in FIG. 1.

FIG. 2. shows a sectional view 200 of a conventional internal power network taken along line A—A in FIG. 1. In FIG.2, it can be clearly seen that the vias 116 that connect metal strip 112 to metal strip 114 are not stacked above the vias 128 and 126 that connect metal strips 104 and 108, respectively, to metal strip 112. In FIG. 2, it can also be seen that metal strips 112 and 114 occupy a significant amount of the total routing space 202 of the chip that might otherwise be used for routing signal conductors between the gates (not shown) of the chip.

Additional layers of metal strips (not shown) for routing power and ground may also be deposited on a semiconductor chip, in a manner similar to that described above. However, each additional metal layer must be configured substantially as depicted in FIG. 2 to provide sufficient current carrying capacity to the metal layer directly adjacent to it. Directly adjacent metal layers, as depicted in FIG. 2 are metal layer one (comprising metal strips 104 and 108) and metal layer two (comprising metal strip 112) or metal layer two and metal layer three (comprising metal strip 114). Metal layer one is not directly adjacent to metal layer three. At the top of a chip, the interconnected metal strips designated as Vcc and the interconnected metal strips designated as Vss are connected to pins of the external package (not show) of the chip. These pins are used to connect the internal power network of the chip to an external power source (not shown).

Figure 3:
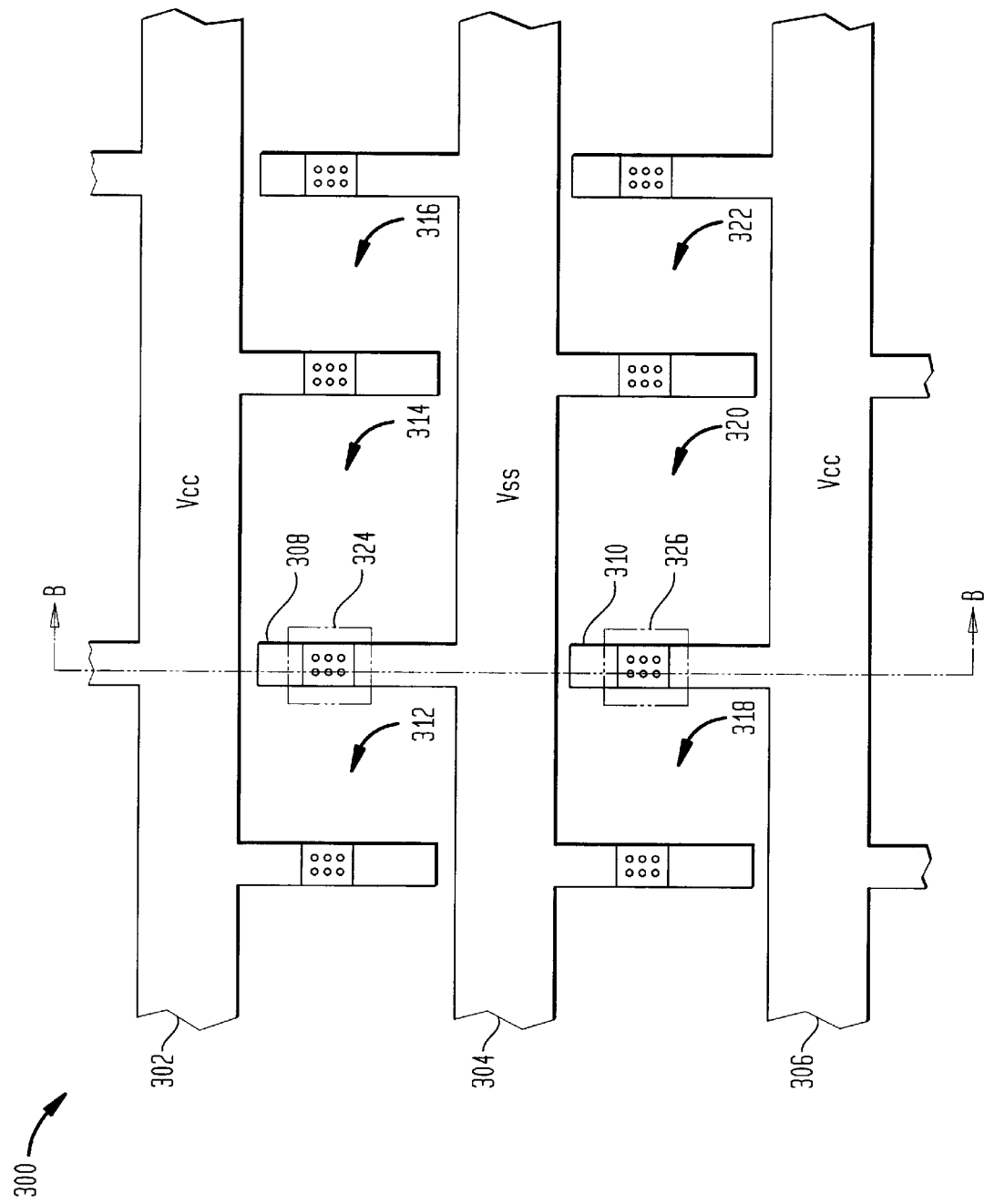
FIG. 3 shows a top view of an internal power network of a semiconductor chip according to the present invention.

FIG. 3 shows a top view 300 of an internal power network of a semiconductor chip according to one embodiment of the present invention. Portions of metal layers one, two, and three are shown. Metal layer one comprises a series of parallel metal strips having perpendicular offshoots. In FIG. 3, metal layer one comprises metal strips 302, 304, and 306. Metal strips 302 and 306 are designated as Vcc. Metal strip 304 is designated as Vss. Perpendicular offshoots 308 and 310 are representative of the perpendicular offshoots that form a part of the metal strips located at metal layer one. This arrangement of metal strips with perpendicular offshoots facilitates provision of power to gates (not shown) disposed in regions 312, 314, 316, 318, 320, and 322 of the semiconductor chip. By forming the gates (not shown) of the chip in these regions, each gate has ready access to Vcc and Vss.

Metal layer two and metal three comprise metal strips located above each of the perpendicular offshoots. For example, two metal strips, one located at metal layer two and one located at metal layer three, are located above each of the perpendicular offshoots 308 and 310, in areas 324 and 326. These metal strips are more clearly seen in FIG. 4.

Figure 4:
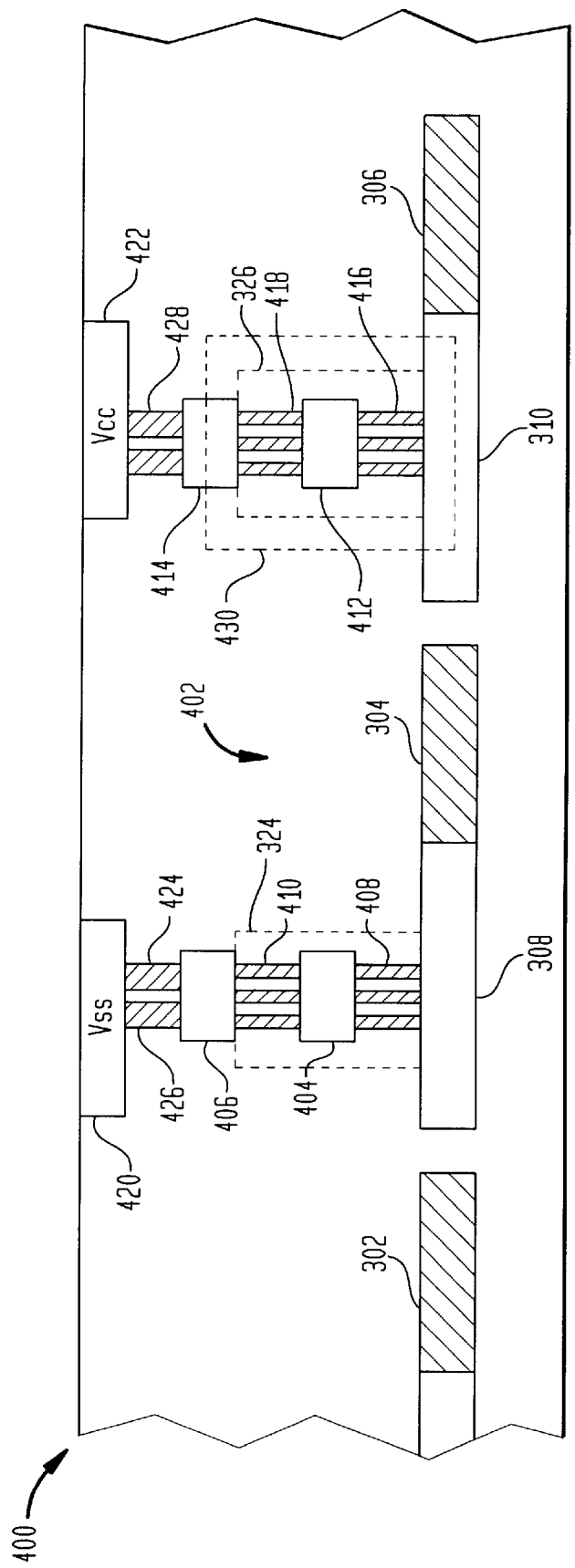
FIG. 4. shows a sectional view of the internal power network of FIG. 3 taken along line B—B in FIG. 3.

FIG. 4 shows a sectional view 400 of an internal power network according to the present invention taken along line B—B in FIG. 3. As noted above, metal layer one comprises the metal strips 302, 304, and 306. In FIG. 4, it can be seen that metal layer two comprises metal strips 404 and 412. Metal layer three comprises metal strips 406 and 414. Finally, a fourth metal layer is represented in FIG. 4 by metal strips 420 and 422. As shown in FIG. 4, each of these metal layers is electrically connected to the metal layer above and below it by a plurality of vias 408, 410, 416, 418. This arrangement greatly increases the amount of routing space, e.g., routing space 402, that is available for routing signal conductors between the gates (not shown) of the chip.

As best seen in FIG. 4, the present invention uses stacked vias to electrically connect the various metal layers of a semiconductor chip that make up a chip's internal power network. The term "stacked via" means there are at least two vias used to electrically connect metal layers, wherein at least one via is located above and in substantial alignment with another via. As depicted in FIG. 4, via 410 is located above and in substantial alignment with via 408.

A stacked via located in area 324 is used to electrically connect metal layer one to metal layer three. The stacked via located in area 324 is shown as routing ground or Vss between metal layer one and metal layer three. This stacked via comprises a plurality of vias, e.g., vias 408 and 410. Vias 408 and 410 electrically connect the metal strips 404 and 406 to the offshoot 308.

A second stacked via located in area 326 is shown as routing power or Vcc between metal layer one and metal layer three. The stacked via in area 326 is shown as comprising a plurality of vias, e.g., vias 416 and 418 that electrically connect the metal strips 412 and 414 to the offshoot 310.

In the embodiment described above, vias 408, 410, 416, and 418 are each designed to carry about one milliamp of current. By using six vias similar to via 416 to connect offshoot 310 to metal strip 412 and six vias similar to via 418 to connect metal strip 412 to metal strip 414, a cell 430 for routing power may be formed that is capable of routing six milliamps. Cell 430 may also be used for routing ground. It will be clear to one skilled in the relevant art that cell 430 may comprise more or less than six vias similar to via 416 and more or less than six vias similar to via 418. It will also be clear to one skilled in the relevant art that vias having electrical and mechanical properties different than the properties of vias 416 and 418 may be used to form cell 430. For example, via 428 is designed to carry about three milliamps of current. Only two vias similar to via 428 are needed to route six milliamps of current between metal strip 422 and metal strip 414.

The invention is well suited for use in implementing internal power networks for routing power and ground. An internal power network, such as the one depicted in FIG. 4, exhibits a voltage drop in the neighborhood of 0.7 percent of the nominal operating voltage at the instance of switching when using cells similar to cell 430, spaced approximately 200 microns apart. In the example embodiment described herein, metal strips similar to metal strip 414 are rectangles, approximately 3.4 microns by 4.4 microns, and they have a resistance of approximately 0.05 ohms. Metal strips similar to metal strip 412 are also rectangles, approximately 3.4 microns by 4.4 microns, and they have a resistance of approximately 0.1 ohms. Vias similar to vias 416, 418, and 428 have a resistance of approximately 0.17 ohms. The combined resistance of an offshoot and its metal strip, similar to offshoot 310 and metal strip 306, is approximately 0.4 ohms. By using cells similar to cell 430 to route power and ground, the routing area occupied by an internal power network of a typical chip can be reduced from approximately 13.3 percent of the chip's total routing area (the area occupied by an internal power network according to the conventional system) to approximately 1.5 percent of the chip's total routing area. Other advantages of using the system and method of the present invention will be apparent to one skilled in the relevant art.

Other embodiments of the present invention are contemplated and will be apparent to one skilled in the relevant art. For example, it is possible to make a variety of different cells for routing power and ground that are capable of carrying a variety of different currents simply by varying the number and size of the vias in the cell.

While various embodiments of the present invention have been described above, it should be understood that they have been described by way of example only, and not limitation. Thus the scope and breadth of the present invention should not be limited by any of the above-described exemplary embodiments, but should be defined only in accordance with the following claims and their equivalents.

What is claimed is:

1. A system for routing power in a semiconductor chip, comprising:

a first metal strip for routing power located at a first metal layer;

a second metal strip for routing power located at a second metal layer, wherein said second metal layer is not directly adjacent to said first metal layer; and a first stacked via connecting said first metal strip to said second metal strip.

2. The system of claim 1, wherein said first stacked via comprises:

a first via connecting said first metal strip to a first intermediate metal strip; and a second via connecting said first intermediate metal strip to said second metal strip.

3. The system of claim 1, further comprising:

a third metal strip for routing ground located at said first metal layer;

a fourth metal strip for routing ground located at said second metal layer; and a second stacked via connecting said third metal strip to said fourth metal strip.

4. The system of claim 3, wherein said second stacked via comprises:

a third via connecting said third metal strip to a second intermediate metal strip; and a fourth via connecting said second intermediate metal strip to said fourth metal strip.

5. The system of claim 4, wherein said first stacked via comprises:

a plurality of vias connecting said first metal strip to a first intermediate metal strip; and a plurality of vias connecting said first intermediate metal strip to said second metal strip.

6. The system of claim 5, wherein said second stacked via comprises:

a plurality of vias connecting said third metal strip to a second intermediate metal strip; and a plurality of vias connecting said second intermediate metal strip to said fourth metal strip.

7. The system of claim 4, further comprising:

a plurality of metal strips for routing power located at said first metal layer; and a plurality of stacked vias connecting said plurality of metal strips located at said first metal layer to said second metal strip located at said second metal layer.

8. The system of claim 7, further comprising:

a plurality of metal strips for routing ground located at said first metal layer; and a plurality of stacked vias connecting said plurality of metal strips located at said first metal layer to said fourth metal strip located at said second metal layer.

9. The system of claim 4, further comprising:

a plurality of metal strips for routing power located at said first metal layer;

a plurality of metal strips for routing power located at said second metal layer; and a plurality of stacked vias connecting said plurality of metal strips located at said first metal layer to said plurality of metal strips located at said second metal layer.

10. The system of claim 9, further comprising:

a plurality of metal strips for routing ground located at said first metal layer;

a plurality of metal strips for routing ground located at said second metal layer; and a plurality of stacked vias connecting said plurality of metal strips located at said first metal layer to said plurality of metal strips located at said second metal layer.

11. A cell for routing power and ground in a semiconductor chip, comprising:
   a first metal strip located at a first metal layer;
   a second metal strip located at a second metal layer, wherein said second metal layer is not directly adjacent to said first metal layer; and
   a stacked via connecting said first metal strip to said second metal strip.

12. The cell of claim 1, wherein said stacked via comprises:
   a first via connecting said first metal strip to an intermediate metal strip; and
   a second via connecting said intermediate metal strip to said second metal strip.

13. The cell of claim 12, wherein said stacked via comprises:
   a plurality of vias connecting said first metal strip to said intermediate metal strip; and
   a plurality of vias connecting said intermediate metal strip to said second metal strip.

14. The cell of claim 13, wherein each of said plurality of vias has a resistance in the range of about 0.5 to 1.5 ohms.

15. The cell of claim 13, wherein each of said plurality of vias is capable of carrying about 1 milliamp.

16. A method for routing power and ground in a semiconductor chip, comprising the steps of:
   providing a first metal strip located at a first metal layer;
   providing a second metal strip located at a second metal layer, wherein said second metal layer is not directly adjacent to said first metal layer; and
   using a stacked via to connect said first metal strip to said second metal strip.

17. The method of claim 16, wherein said step of using a stacked via comprises the steps of:
   using a first via to connect said first metal strip to an intermediate metal strip; and
   using a second via to connect said intermediate metal strip to said second metal strip.

18. The method of claim 17, wherein said step of using a stacked via comprises the steps of:
   using a plurality of vias to connect said first metal strip to an intermediate metal strip; and
   using a plurality of vias to connect said intermediate metal strip to said second metal strip.

19. The method of claim 16, further comprising the steps of:
   providing a plurality of metal strips located at said first metal layer; and
   using a plurality of stacked vias to connect said plurality of metal strips located at said first metal layer to said second metal strip located at said second metal layer.

20. The method of claim 16, further comprising the steps of:
   providing a plurality of metal strips located at said first metal layer;
   providing a plurality of metal strips located at said second metal layer; and
   using a plurality of stacked vias to connect said plurality of metal strips located at said first metal layer to said plurality of metal strips located at said second metal layer.

* * * * *